United States Patent [19]

Lau

[11] Patent Number: 5,155,888

[45] Date of Patent: Oct. 20, 1992

[54] SEMICONDUCTOR WAFER LIFTER

[75] Inventor: John J. Lau, Dallas, Tex.

[73] Assignee: Mactronix, Dallas, Tex.

[21] Appl. No.: 704,421

[22] Filed: May 22, 1991

[51] Int. Cl.$^5$ .............................................. H01L 21/68
[52] U.S. Cl. ................................... 29/25.01; 118/500; 483/14
[58] Field of Search ............................... 29/25.01, 568

[56] References Cited

FOREIGN PATENT DOCUMENTS

| | | | |
|---|---|---|---|
| 57-166045 | 10/1982 | Japan | 29/25.01 |
| 58-90735 | 5/1983 | Japan | 29/25.01 |
| 59-104138 | 6/1984 | Japan | 29/25.01 |
| 60-37723 | 2/1985 | Japan | 29/25.01 |

*Primary Examiner*—Olik Chaudhuri
*Assistant Examiner*—Andrew Griffis
*Attorney, Agent, or Firm*—Ross, Howison, Clapp & Korn

[57] ABSTRACT

A wafer lifting apparatus is comprised of guide rails (10) that are disposed on a supporting surface (22). A lifting apparatus (24) is disposed on the surface (22), having an inclined surface (26). Grooves (28) are disposed on the inclined surface and spaced apart a distance equal to that of wafers (20) in a wafer handling boat (16). The wafer handling boat (16) has the end pieces (12) and (14) urged downward into the guide rails (10) until the lowermost peripheral edges of the wafers (20) contact the grooves (28) in the inclined surface (26). When fully lowered, the rearmost ones of the wafers (20) are completely lifted out of the boat such that they are supported entirely by the grooves (28). In this manner, they can be viewed from the end of the wafer lifting apparatus. A flat finding device in the form of a flat finding cylinder (44) is also provided in an opening (38) on a supporting surface (36) for holding the boat (16). The wafer handling cylinder (44) is operated to find the flat (32) on the wafer (20) and then a platform (54) urged upward from underneath the surface (36) to urge the wafers (20) upward on combs (68) and (70), that are also disposed at an inclined angle.

7 Claims, 4 Drawing Sheets

SEMICONDUCTOR WAFER LIFTER

TECHNICAL FIELD OF THE INVENTION

The present invention pertains in general to devices for lifting semiconductor wafers out of a wafer boat, and more particularly, to a device for lifting wafers at an angle with respect to the wafer holding boat to expose the edges thereof for viewing by an operator.

BACKGROUND OF THE INVENTION

Semiconductor wafers are typically processed and transported in what is termed a "wafer boat". The wafer boat holds the wafers in a configuration such that the processing surfaces thereof are disposed parallel to each other and spaced a predetermined distance apart. In order to maximize processing capacity, the wafers are disposed as close together as possible. This distance is such that the surface of the wafer is essentially hidden from view.

In certain circumstances, it is desirable to view the front of one surface of the wafer. This is necessary in order to either determine that the wafer surface is, in fact, oriented in the proper direction, and also to view markings that are oftentimes disposed on the edge of the wafer. This has been facilitated in the past by disposing an inclined surface beneath the wafer boat and lowering the wafer boat down onto the inclined surface to slightly raise the wafers within the boat such that an individual looking substantially perpendicular to the surface of the wafers and at one end of the wafer boat will see the edge of each of the wafers. However, in order to maintain the spacing between the wafers in the prior art system, it is necessary to maintain the wafers in such a configuration that they at all times contact the slots in which they reside in the wafer boat. Therefore, it is not possible to raise the rearmost wafer a sufficient amount to adequately expose all the edges of all the wafers in the boat due to the limitation of the height of the wafer boat and the slots therein.

SUMMARY OF THE INVENTION

The present invention disclosed and claimed herein comprises a wafer lifting apparatus for lifting semiconductor wafers from a wafer support device wherein the wafers are disposed in a substantially parallel configuration and at a predetermined distance. The apparatus includes the guide mechanism for receiving the wafer support device and a wafer lifting device disposed within the guide mechanism. The wafer lifting device has an inclined surface that is inclined at a predetermined angle to the wafers in the wafer support device. The wafer lifting device is operable to contact the edges of the wafers in the wafer support device when the wafer support device and the wafer lifting device are urged together. The inclined surface has a surface that substantially prevents lateral movement of the peripheral edges of the wafers along the inclined surface. The guide mechanism is operable to allow to the wafer lifting device to urge the wafers upward from a resting position in the wafer support device at an angle to the wafer support device, the angle being substantially equal to the angle of the inclined surface. At least one of the wafers in the wafer support device is completely removed therefrom.

In another aspect of the present invention, the guide mechanism includes four guide rails operable to receive the edges of a rectangular shaped wafer support device which is comprised of a wafer handling boat. The wafer lifting device includes a support member for supporting an inclined surface with a plurality of grooves disposed therein. The support member is disposed within the guide rails. The wafer handling boat is then lowered into the guide rails and over the inclined surface wherein the wafers are urged upward within the wafer handling boat.

In a further aspect of the present invention, the guide mechanism includes a support surface with an opening disposed therein. The support surface is operable to receive the wafer handling boat on the upper end thereof and orient it such that it is directly over the opening. A reciprocating platform is disposed beneath the opening and operable to hold the support member with the inclined surface. A reciprocating motor is then operable to reciprocate the platform upward through the opening to urge the inclined surface against the lowermost peripheral edges of the wafers such that the wafers are urged upward within the wafer handling boat.

In a yet further aspect of the present invention, a flat finding device is provided on the support surface and is operable to orient the flat of the wafers in a predetermined position after the wafer handling boat is disposed on the support surface and prior to urging the reciprocating platform upward into the opening.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
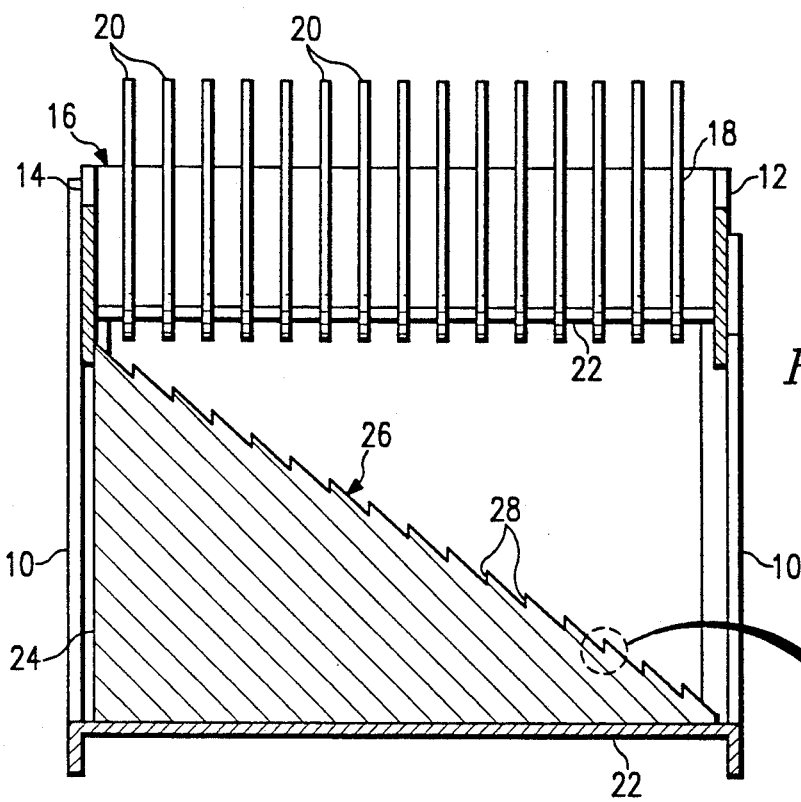
FIG. 1 illustrates a cross-sectional side view of the wafer lifter with the wafer boat disposed above the lifter.

Referring now to FIG. 1, there is illustrated a side cross-sectional view of the wafer lifting apparatus of the present invention. The wafer lifter is comprised of four corner guide rails 10, two of which are shown in the side view of FIG. 1. The guide rails 10 on each side are disposed apart slightly more than the end pieces 12 and 14 of a wafer handling boat 16. The wafer handling boat 16 has a plurality of slots 18 on the sides thereof into which wafers 20 are disposed. At the lower end, the slot extends inward to form a comb 22 that is an inward extension of the slots 18, the comb 22 being disposed such that the distance between combs 22 on either side of the boat 16 is less than the diameter of the wafer 20. Therefore, the wafers 20 will rest in the slots 18 with the lowermost portion comprising the comb 22, preventing further downward travel of the wafers 20. The slots 18 provide the spacing function.

Figure 1A:
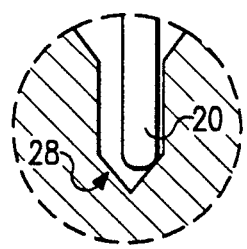
FIG. 1a illustrates a detail of the groove.

In FIG. 1, the process for lifting the wafers is initiated by inserting the boat 16 into the wafer handling apparatus with the end pieces 12 and 14 disposed proximate to the corner pieces 10. A base 22 is provided for supporting the guide rails 10 at each of the corners thereof and also is operable to support a support member 24. The support member 24 has a lower flat surface and an inclined surface 26 on the upper side thereof. The inclined surface 26, as will be described hereinbelow, is operable to receive the lowermost edge of the wafers 20 and urge them upward and, for some wafers, remove them from the wafer handling boat 16. The inclined surface 26 is illustrated as having a plurality of grooves 28 disposed therein, the grooves 28 for receiving the wafers 20 and allowing them to be lifted up and out of the boat 16. However, it is only important that the inclined surface 26 be such that the wafers 20 do not move along its surface when raised. Therefore, the surface could be a very low friction rubber surface or the such without the requirement for grooves. A detail of the groove is illustrated in FIG. 1a, where it can be seen that the groove 28 is shaped such that it will hold the wafer apart from the boat 16, as will be described hereinbelow.

Figure 2:
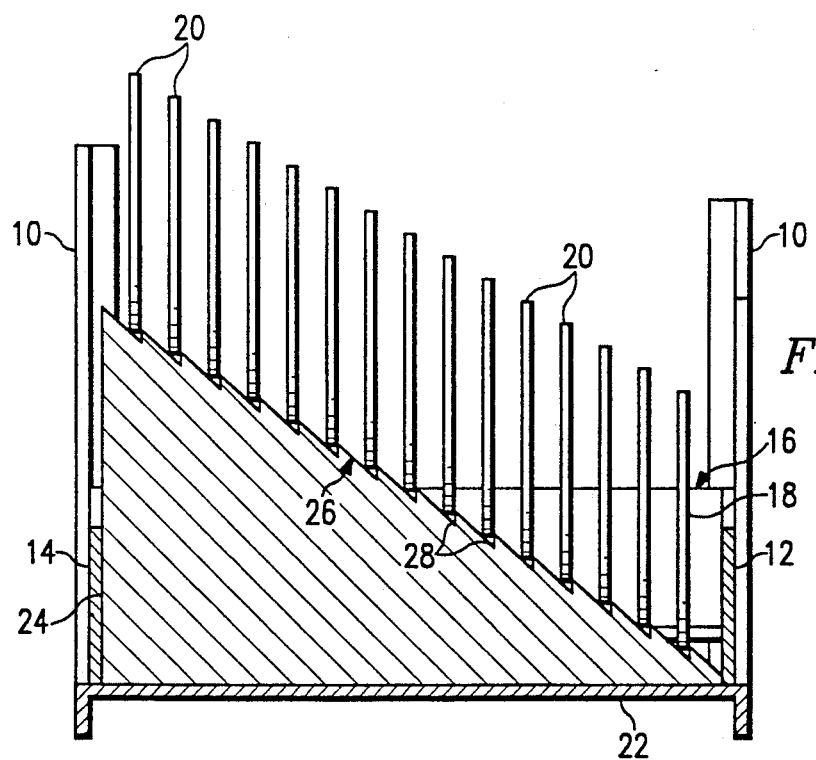
FIG. 2 illustrates the view of FIG. 1 with the wafer boat lowered down onto the lifter.

Referring now to FIG. 2, there is illustrated the second step of lowering the boat 16 down into the wafer handling apparatus until it rests on the base 22. When this occurs, it can be seen that the rearmost ones of the wafers 20 are lifted completely out of the boat 16 such that they do not contact the slots 18 in the boat 16. Of course, this only occurs for the rearmost ones of the wafers 20, with the edge of each of the wafers 20 resting in one of the grooves 28. Therefore, the grooves 28 are spaced apart the same distance as the slots 18 in the wafer handling boat 16. The inclined surface 26 is at such an angle that the edges of the wafers 20 will be viewable from the end of the wafer handling apparatus.

Figure 3A:
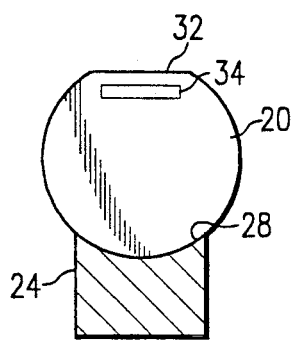
FIGS. 3a and 3b illustrate alternate embodiments of the wafer lifter in a cross-sectional side view.
Figure 3B:
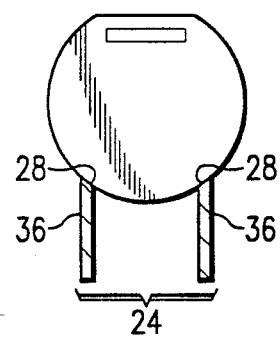

Referring now to FIGS. 3a and 3b, there are illustrated two embodiments of the wafer lifter 24. In the first embodiment of FIG. 3a, the wafer lifter 24 is a solid member with each of the grooves 28 on the inclined surface 26 being a curved and indented surface that supports the lower peripheral edge of one of the wafers 20. It can be seen that the wafer 20 is disposed such that a flat 20 or a flat 32 is disposed on the wafer 20 and is disposed upward. A marking area 34 may also be provided on the upper edge of the wafer 20 proximate to the flat 32, which marking area 34 can be viewed when the wafers are disposed in the lifting apparatus. The embodiment of FIG. 3b illustrates two combs or rails 36 that are disposed a predetermined distance apart, with each comb or rail 36 having at its upper end thereof part of the groove 28. The rails 36 are disposed a predetermined distance apart, but less than the diameter of the wafer 20 and also disposed such that they can fit through the bottom of a standard wafer handling boat 16.

Figure 4:
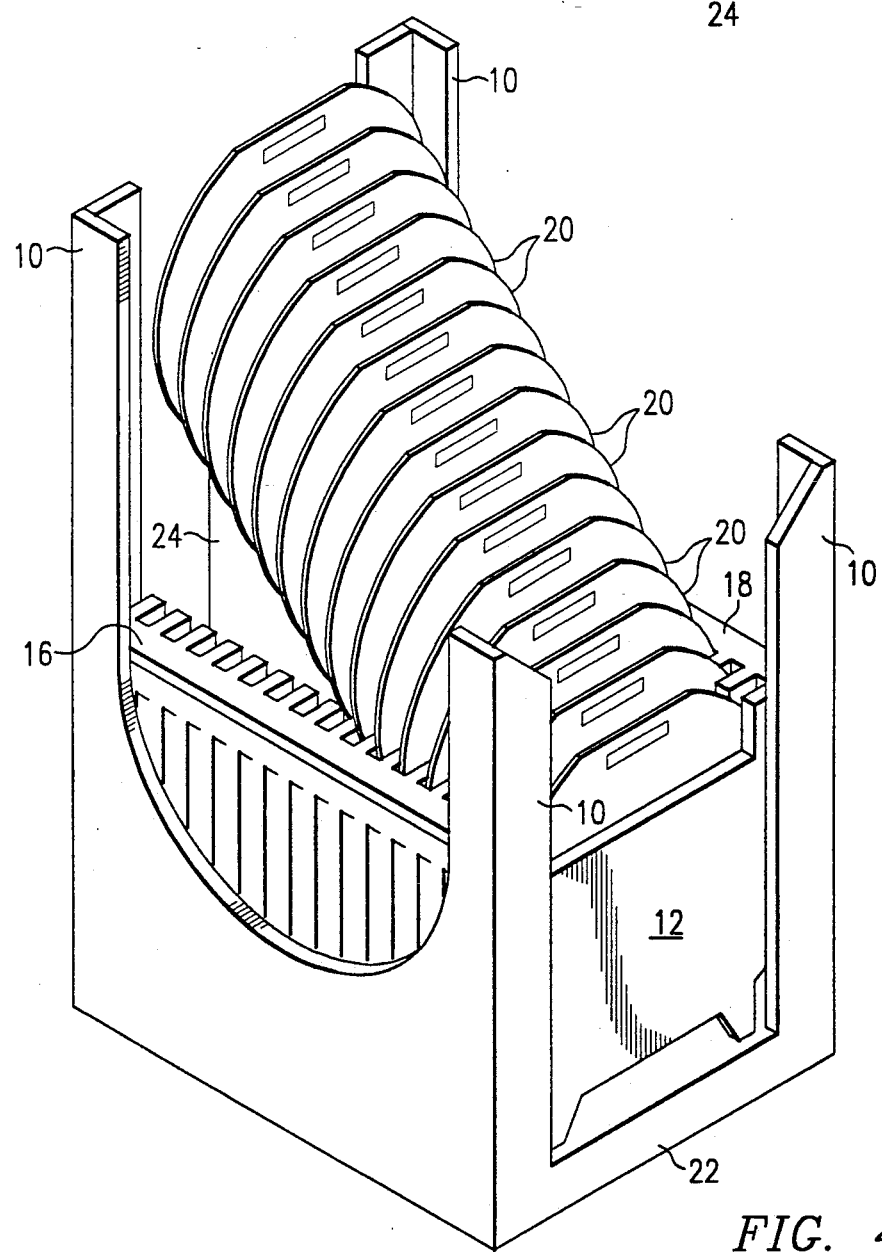
FIG. 4 illustrates a perspective view of the wafer lifter.

Referring now to FIG. 4, there is illustrated a perspective view of the wafer handling apparatus in the configuration of FIG. 2. It can be seen that the edges of the wafers are 75-90% visible, and that the rearmost ones of the wafers 20 is substantially removed from the wafer handling boat 16.

Initially, the operation is begun by finding the flats on the edges of the wafers. This is a conventional process and essentially entails slightly lifting the wafers from the boat and then putting a longitudinal and cylindrical member beneath them that is disposed at such a distance that when the flats are incurred on the bottom of the boat, the wafers will not rotate. Thereafter, the longitudinal member is urged upward against the flats and the wafer is rotated 180°, such that the flats are disposed on the top of the wafer handling boat 16. Again, this is a conventional process. However, the flats could be at any position initially and then rotated to any other position, this being a function of the flat finder.

Figure 5:
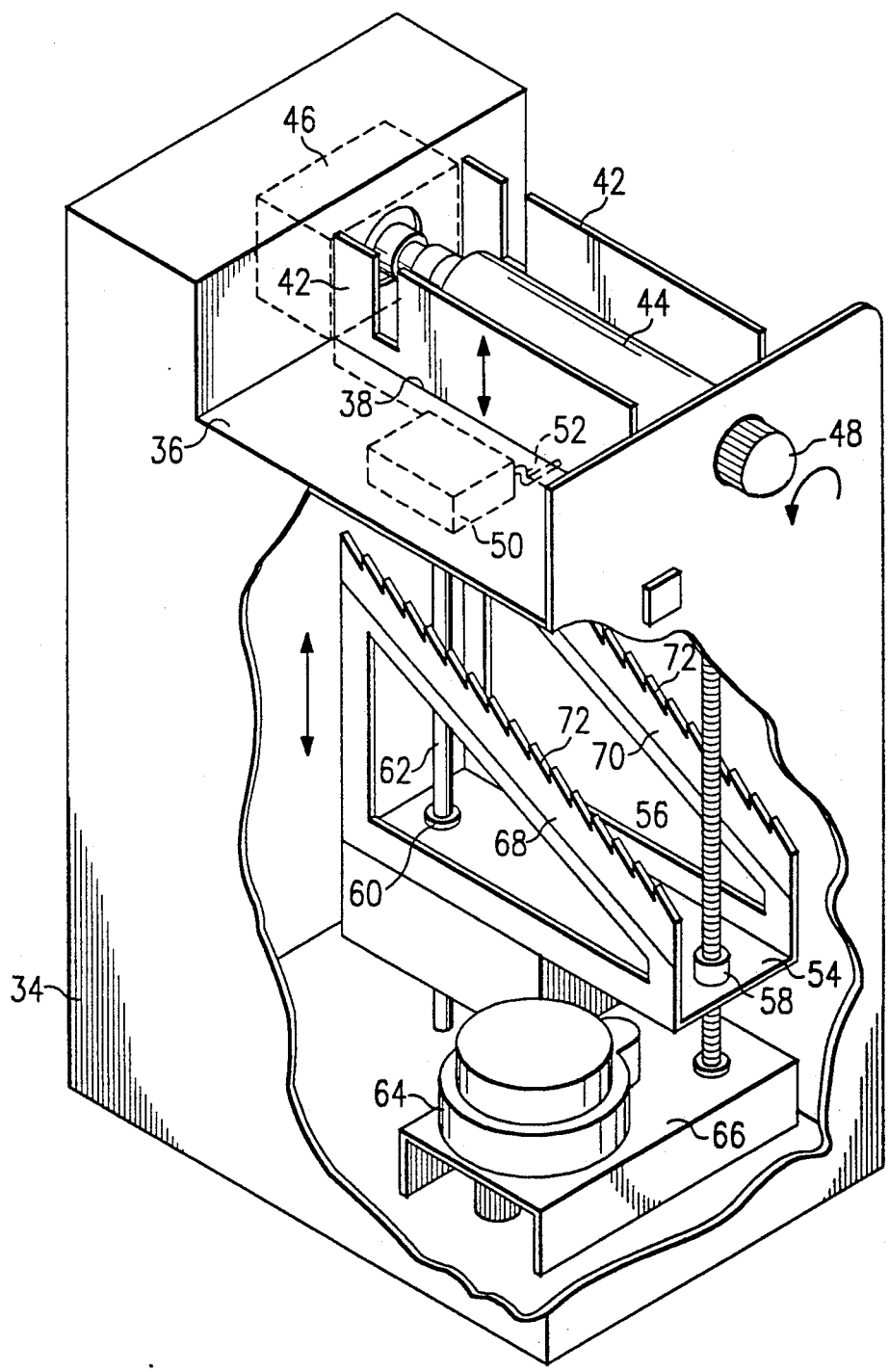
FIG. 5 illustrates a perspective view of an alternate embodiment showing automated flat finding and lifting.

Referring now to FIG. 5, there is illustrated a perspective view of an alternate embodiment of the present invention illustrating an automated flat finder/wafer lifting apparatus. A chassis 34 is provided that is operable to form a supporting surface 36 on the upper side thereof to support a wafer handling boat. The support surface 36 has an opening 38 disposed therein, the opening 38 having two reciprocating edges 42 disposed along the longitudinal edges thereof. As will be described hereinbelow, the reciprocating edges 42 are operable to reciprocate upward and slightly raise the wafers 20 for the purpose of flat finding. A flat finding cylinder 44 is disposed in the opening 38 and interfaced with a motor 46 on one end thereof. A manual knob 48 is disposed on the opposite side thereof to allow for manual flat finding. The reciprocating edges 42 are operated by a solenoid 50 that actuates a cam 52 to reciprocate the reciprocating edges 42 up and down.

Beneath the support surface 36, a reciprocating platform 54 is provided. The reciprocating platform 54 is reciprocated upward by a longitudinal screw member 56 and a cooperating threaded member 58 on the platform 54 at one end thereof. A guide hole 60 is disposed at the opposite end of the platform 58 with a guide rail 62 disposed therethrough., Therefore, when the longitudinal screw member 56 is rotated, the platform 54 will reciprocate upward and downward along the guide rail 62. The longitudinal screw member 56 is operated by a motor 64 in a motor housing 66.

The platform 54 is operable to hold two comb 68 and 70, the combs 68 and 70 being disposed at an angle to the surface of the platform 54, which platform 54 is disposed parallel to the surface of the chassis 34 and also the support surface 36. The combs 68 and 70 have grooves 72 disposed therein that are similar to the grooves 28 in the lifting member 24 of FIGS. 1 and 2.

Figure 6C:
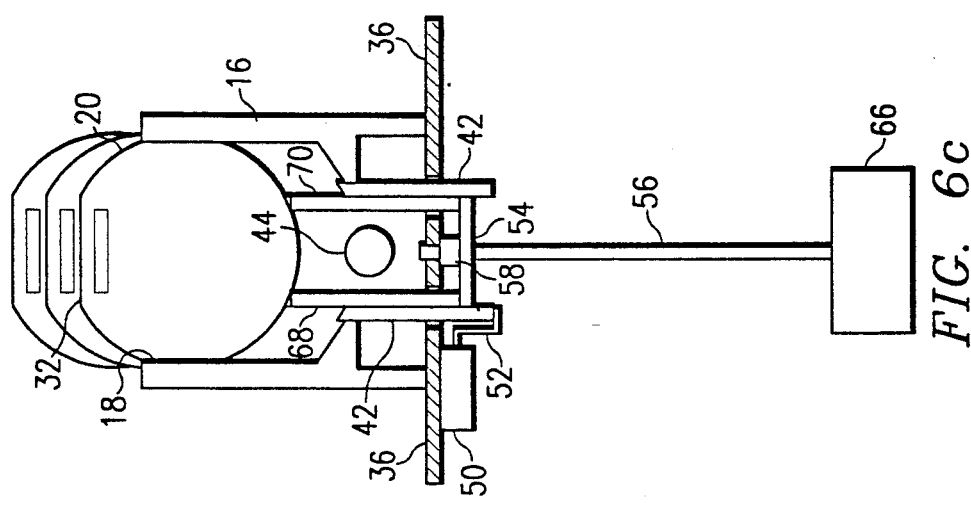
FIGS. 6a-6c illustrate the operation of the embodiment of FIG. 5.
Figure 6B:
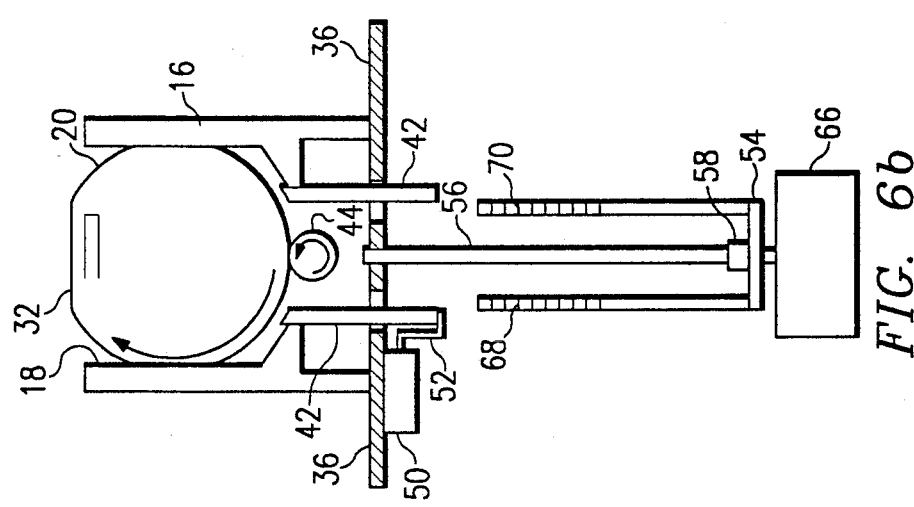
Figure 6A:
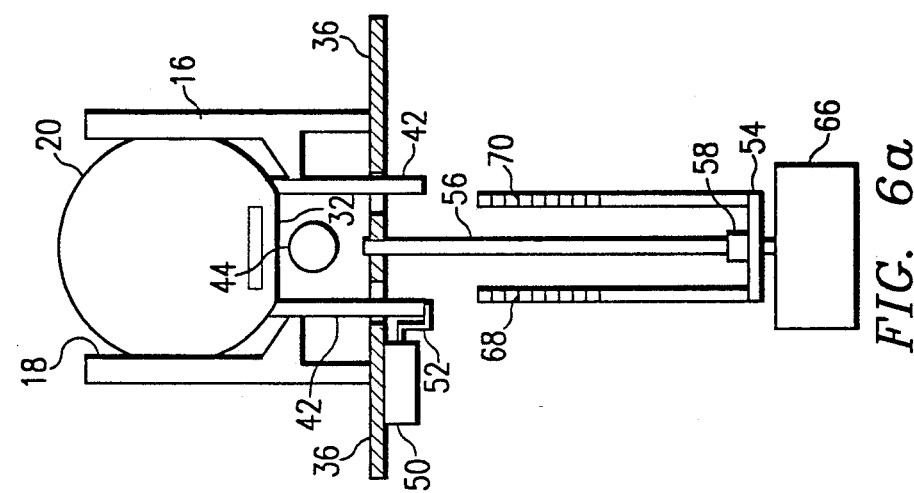

The operation of the embodiment of FIG. 5 will be illustrated with respect to FIGS. 6a-6c. In FIG. 6a, the wafer handling boat 16 with wafers 20 are disposed on the surface 36 with the platform 54 disposed in the downwardmost position. When the wafer handling boat 16 is disposed on the surface 36, the reciprocating edges 42 are reciprocated upward to contact the peripheral edges of the wafers 20 to raise them slightly upward in the slots 18 within the wafer handling boat 16. The upward reciprocation is sufficient such that when the flat 32 on the wafers 20 are oriented such that they are parallel to the surface 36, rotation of the flat finding cylinder 44 rotates, the wafers 20 will not rotate.

Referring now to FIG. 6a, there is illustrated the next step in the operation of the embodiment of FIG. 5. In the step of FIG. 6b, the reciprocating edges 42 are reciprocated downward by the cam 52 and the solenoid 50 and then the flat finding cylinder 44 rotated a predetermined number of revolutions such that the wafers 20 will rotate approximately 180°. In this manner, the flats 32 will be disposed in the upper position.

Referring now to FIG. 6c, the last step in the operation is illustrated. In the step of FIG. 6c, the longitudinal threaded member 56 is rotated such that the platform 54 is reciprocated upward and the combs 68 and 70 are also reciprocated upward to contact the peripheral edges of the wafer 20 and urge it upward within the slots 18. The wafer 20 illustrated in FIG. 6c is one of the rearmost wafers, and therefore, this wafer is urged upward and out of the boat. Therefore, the embodiment of FIG. 5 is operable to provide automated flat finding followed by rotation of the flats upward and then lifting of the wafers out of the boat at an inclined angle thereto. This operation can then be reversed to pull the platform 54 downward into the chassis 34 to place the wafers back into the slots 18 from which they originally were removed.

In summary, there has been provided a wafer lifting apparatus. The wafer lifting apparatus is comprised of an inclined surface having a plurality of supporting grooves therein. The inclined surface is at such an angle that when a wafer handling boat is disposed thereover, the rearmost wafers are urged upward and out of the boat and supported in the grooves. When the boat is lifted up off of the inclined surface, the wafers again are lowered into the boat. Guide rails are provided to receive the outermost corners of the wafer handling boat such that the wafer handling boat can easily be lowered onto the reciprocating surface and urged upward therefrom. Alternately, the inclined surface can be combined with a flat finder and automated. In the automated configuration, the wafer handling boat is disposed on a supporting surface, the flats of the wafers oriented in an upward configuration and then a platform holding the inclined surface urged upward beneath and through the wafer handling boat to urge the wafers upward at an inclined orientation.

Although the preferred embodiment has been described in detail, it should be understood that various changes, substitutions and alterations can be made therein without departing from the spirit and scope of the invention as defined by the appended claims.

What is claimed is:

1. A semiconductor wafer lifting apparatus for lifting semiconductor wafers from a wafer support device wherein the wafers are disposed in a substantially parallel and adjacent configuration along a common perpendicular axis to the radial center of each wafer and comprising:
    a guide mechanism for receiving the wafer support device;
    a wafer lifting device disposed within said guide mechanism;
    said wafer lifting device having an inclined surface inclined at an angle to the planar surface of the wafers in the wafer support device that is less than 90° and operable to contact the edges of the wafers in the wafer support device on the lowermost peripheral edges thereof;
    said inclined surface extending substantially parallel to the common perpendicular axis when the wafers are in a resting position, said inclined surface having a surface that substantially prevents lateral movement of the peripheral edges of the wafers along said surface; and
    said guide mechanism operating to allow said wafer lifting device to urge the wafers upward from the resting position and at an angle to the wafer support device substantially equal to the angle of said inclined surface, the surfaces of adjacent wafers offset from each other as they are urged upward and remaining in a parallel relationship with at least one of the wafers completely removed from the wafer support device.

2. The wafer lifting apparatus of claim 1, wherein said guide mechanism comprises a lower support surface and upwardly extending guide rails for cooperating with the corners of the wafer support device, the wafer support device being substantially rectangular in shape, said wafer lifting device disposed in the lower portion of said guide mechanism and between said guide rails and operable to allow the wafer support device to be lowered into said guide rails and onto said inclined surface.

3. The wafer lifting apparatus of claim 1, wherein said inclined surface is comprised of a plurality of supporting grooves, said supporting grooves disposed a predetermined distance apart such that they receive the peripheral edges of the wafers in the wafer support device when said wafer lifting device is urged upward into the wafer support device.

4. The wafer lifting apparatus of claim 1, wherein the at least one of the wafers that is completely removed from the wafer support device is substantially the rearmost one of the wafers in the wafer support device.

5. The wafer lifting apparatus of claim 1, wherein said inclined surface is in a substantially common plane.

6. The wafer lifting apparatus of claim 1, wherein said guide mechanism comprises:
    a support surface for receiving and orienting the wafer support device;
    an opening disposed in said support surface beneath the wafer support device when disposed on said support surface;
    a reciprocating platform disposed beneath said opening in said support surface, said reciprocating platform operable to hold said wafer lifting device thereon; and
    a reciprocating motive device for operating said platform to move upward into said opening such that said wafer lifting device is urged upward into the wafer support device when the wafer support device is disposed on said support surface.

7. The wafer lifting apparatus of claim 6 and further comprising flat finding means for orienting the flats in the wafers disposed in the wafer support device when the wafer support device is disposed on said support surface.

* * * * *